United States Patent
Choi

(10) Patent No.: US 7,236,028 B1
(45) Date of Patent: Jun. 26, 2007

(54) ADAPTIVE FREQUENCY VARIABLE DELAY-LOCKED LOOP

(75) Inventor: Dong-Myung Choi, Nashua, NH (US)

(73) Assignee: National Semiconductor Corporation, Santa Clara, CA (US)

( * ) Notice: Subject to any disclaimer, the term of this patent is extended or adjusted under 35 U.S.C. 154(b) by 167 days.

(21) Appl. No.: 11/187,992

(22) Filed: Jul. 22, 2005

(51) Int. Cl.
    H03L 7/06 (2006.01)
(52) U.S. Cl. .................. 327/158; 327/149; 327/161
(58) Field of Classification Search ............. 327/149, 327/152, 153, 158, 161–163
    See application file for complete search history.

(56) References Cited

U.S. PATENT DOCUMENTS

| | | | |
|---|---|---|---|
| 5,463,337 A * | 10/1995 | Leonowich | 327/158 |
| 6,026,050 A * | 2/2000 | Baker et al. | 365/233 |
| 6,326,826 B1 | 12/2001 | Lee et al. | 327/161 |
| 6,424,193 B1 * | 7/2002 | Hwang | 327/158 |
| 6,731,148 B2 | 5/2004 | Lau et al. | 327/158 |
| 6,861,886 B1 | 3/2005 | Ludden et al. | 327/156 |
| 6,906,570 B2 * | 6/2005 | Kim | 327/292 |
| 2002/0079937 A1 | 6/2002 | Xanthopoulos | 327/158 |
| 2004/0223571 A1 | 11/2004 | Donnelly et al. | 375/371 |
| 2004/0227550 A1 | 11/2004 | Byun | 327/158 |

OTHER PUBLICATIONS

Stefanos Sidiropoulos et al., "A Semidigital Dual Delay-Locked Loop", IEEE Journal of Solid-State Circuits, vol. 32, No. 11, Nov. 1997, pp. 1683-1692.

* cited by examiner

Primary Examiner—Timothy P. Callahan
Assistant Examiner—Hai L. Nguyem
(74) Attorney, Agent, or Firm—Patent Law Group LLP; Carmen C. Cook

(57) ABSTRACT

A delay-locked loop circuit receiving an input clock signal and generating an output clock signal whose delay is locked to the input clock includes a voltage controlled delay line (VCDL), a multiplexer, a phase detection control loop and a phase selection control loop. The VCDL generates a set of multi-phase delayed clock signals. The multiplexer selects one of the delayed clock signals as the output clock signal based on a select signal. The phase detection control loop measures the phase difference between the input and output clock signals and generate a control voltage for driving the VCDL. The phase selection control loop measures the control voltage and generates the select signal based on the control voltage, causing the multiplexer to select a delayed clock signal with increased or decreased amount of phase delay relative to the currently selected delayed clock signal or to hold the currently selected delayed clock signal.

13 Claims, 6 Drawing Sheets

ADAPTIVE FREQUENCY VARIABLE DELAY-LOCKED LOOP

FIELD OF THE INVENTION

The invention relates to delay-locked loops and, in particular, to a delay-locked loop that can track a wide frequency range.

DESCRIPTION OF THE RELATED ART

Clock signals are used in electronic systems to control the timing and processing of various operations. It is often necessary to synchronize the clock signals that are distributed to several integrated circuits within an electronic system to ensure proper operation. Phase-locked loop (PLL) and delay-locked loop (DLL) are two circuits that are widely used for clock regeneration in electronic systems so as to synchronize the local clock on each integrated circuit to the desired reference circuit.

In the phase-locked loop, a voltage-controlled oscillator produces a local clock. The phases of the local clock and a reference clock are compared by a phase-frequency detector, with the resulting error signal used to drive the voltage-controlled oscillator via a loop filter. The feedback via the loop filter phase locks the local clock to the reference clock. On the other hand, the delay-locked loop generates a synchronized local clock by delaying the incoming reference clock by an integer number of periods.

The DLL has become more popular because of its better stability and better jitter performance than the PLL. However, the DLL has a major limitation associated with its narrow frequency locking or tracking range. The delay-locked loop adjusts the amount of additional delay in order to achieve the desired synchronization, but this adjustment is essentially a phase adjustment. The conventional delay-locked loop lacks any significant frequency adjustment, thus limiting the overall frequency range of conventional delay-locked loops.

FIG. 1 is a schematic diagram of a conventional delay-locked loop. Referring to FIG. 1, a conventional delay-locked loop 10 includes a voltage controlled delay line (VCDL), a phase detector, a charge pump and a loop filter. The input clock (iclk) drives a first end of the delay line which may include a number of cascaded variable delay buffers. The output clock (clk) is coupled to the phase detector. A reference clock (refclk), which is either the input clock (iclk) or a version of the input clock, is also coupled to the phase detector to be compared with the output clock (clk). The output signal of the phase detector, indicative of the phase difference between the output clock and the input clock, is coupled to drive a charge pump. The output current level of the charge pump circuit is integrated by the capacitor functioning as the loop filter to generate the control voltage $V_C$ for the VCDL. The feedback loop of DLL 10 operates to drive the control voltage $V_C$ to a value which would force a zero phase error between the output clock and the reference clock.

An important limitation of the conventional DLL architecture of FIG. 1 is that the conventional DLL has a limited frequency locking range. The frequency locking range of the DLL is often much less than that provided by a typical PLL. Techniques for increasing the dynamic range of the DLL have been proposed. A common solution is to employ phase interpolation in DLL circuits. For example, Stefanos Sidiropoulos et al. in a paper entitled "A Semidigital Dual Delay-Locked Loop", IEEE Journal of Solid-State Circuits, vol. 32, No. 11, November 1997, describes a dual delay-locked loop architecture for achieving low jitter and large operating range. In the Sidiropoulos paper, a core loop is used to generate coarsely spaced clocks, which are then used by a peripheral loop to generate the main system clock through phase interpolation. Using phase interpolation in DLL has several limitations. For example, the phase interpolator must have very good linearity to ensure accuracy of the interpolation. Also, interpolation discontinuity of each phase plane needs to be seamless to avoid jitter peaking at the phase boundary. Even if the interpolation is ideally linear, the minimum jitter of a DLL using phase interpolation is still quite high.

Other conventional methods for improving the frequency locking range of the DLL require additional multiple clock generation at the front end of the DLL. The additional clock generation required is implemented either as a PLL or as another DLL and each has its own limitations as described above.

Accordingly, it is desirable to provide a DLL with increased frequency operating range while avoiding the limitations of the prior art.

SUMMARY OF THE INVENTION

According to one embodiment of the present invention, a delay-locked loop circuit receiving an input clock signal and generating an output clock signal whose delay is locked to the input clock includes a voltage controlled delay line, a multiplexer, a phase detection control loop and a phase selection control loop. The voltage controlled delay line includes multiple delay elements. The voltage controlled delay line receives the input clock signal and generates a set of delayed clock signals having increasing amount of phase delay from a first delayed clock signal to a last delayed clock signal. The set of delay elements is controlled by a control voltage operative to vary the amount of phase delay provided by each delay element. The multiplexer receives the set of delayed clock signals as input signals and also receives a select signal. The multiplexer provides a selected one of the delayed clock signals as an output signal based on the select signal. The output signal of the multiplexer is the output clock signal. The phase detection control loop is adapted to measure the phase difference between the input clock signal and the output clock signal and to generate the control voltage to adjust the amount of delay provided by each delay element in the voltage controlled delay line. Finally, the phase selection control loop is adapted to measure the voltage level of the control voltage and, based on the voltage level of the control voltage, to generate the select signal for the multiplexer to cause the multiplexer to select a delayed clock signal with an increased or decreased amount of phase delay relative to the currently selected delayed clock signal or to hold the currently selected delayed clock signal.

In one embodiment, the phase selection control loop generates the select signal to cause the multiplexer to select a delayed clock signal with an increased amount of delay relative to the currently selected delayed clock signal when the control voltage has a voltage level greater than a high threshold voltage. Moreover, the phase selection control loop generates the select signal to cause the multiplexer to select a delayed clock signal with a decreased amount of delay relative to the currently selected delayed clock signal when the control voltage has a voltage level less than a low threshold voltage. Finally, the phase selection control loop generates the select signal to cause the multiplexer to hold the currently selected delayed clock signal when the control voltage has a voltage level between the high threshold voltage and the low threshold voltage.

The present invention is better understood upon consideration of the detailed description below and the accompanying drawings.

DETAILED DESCRIPTION OF THE PREFERRED EMBODIMENTS

In accordance with the principles of the present invention, a delay-locked loop (DLL) includes a voltage controlled delay line (VCDL) receiving an input clock signal and generating multiple clock phases as a set of delayed clock signals and a clock phase multiplexer selecting one of the delayed clock signals as the output clock signal for the DLL. The DLL includes a phase selection control loop to select one of the delayed clock signals based on the amount of delay required and a phase detection control loop to adjust the phase error within the selected clock phase so as to lock the delay of the selected delayed clock signal to the input clock signal. By incorporating the phase selection control loop and the phase detection control loop in the DLL, the DLL of the present invention can achieve a wide frequency locking range while providing excellent jitter performance.

In one embodiment, the phase detection control loop generates a control voltage for the VCDL for adjusting the frequency of the multiple clock phases. The phase selection control loop includes a delay window detector for monitoring the control voltage of the VCDL and generating a phase select signal for the clock phase multiplexer based on the voltage level of the VCDL control voltage. The phase select signal directs the clock phase multiplexer to select a suitable clock phase amongst the multiple clock phases as the output clock signal. By selecting a clock phase from the set of multiple clock phases having an incrementally increasing amount of delay, the DLL of the present invention can thus be provided with an expanded frequency operation range.

More specifically, in the DLL of the present invention, selection of one of the multiple clock phases generated from the VCDL constitutes as a coarse frequency selection while the control voltage driving the VCDL constitutes a fine frequency adjustment. The delay window detector forms a feedback control loop in the DLL for monitoring the control voltage of the VCDL. The delay window detector continuously controls the clock phase multiplexer to select a suitable clock phase to be used to generate the final output clock signal. Because the multiple clock phases correspond to clock signals generated by an incrementally increasing number of delay stages in the VCDL, the delay window detector effectively provides dynamic control in selecting a variable number of delay stages from the VCDL for use in generating the output clock signal. In this manner, the DLL of the present invention can operate with extremely large frequency locking range and optimum power consumption. By changing the number of delay stages used for the output clock signal, the DLL can track frequency variations of the input frequency ranging from a few MHz to a few GHz.

Figure 2:
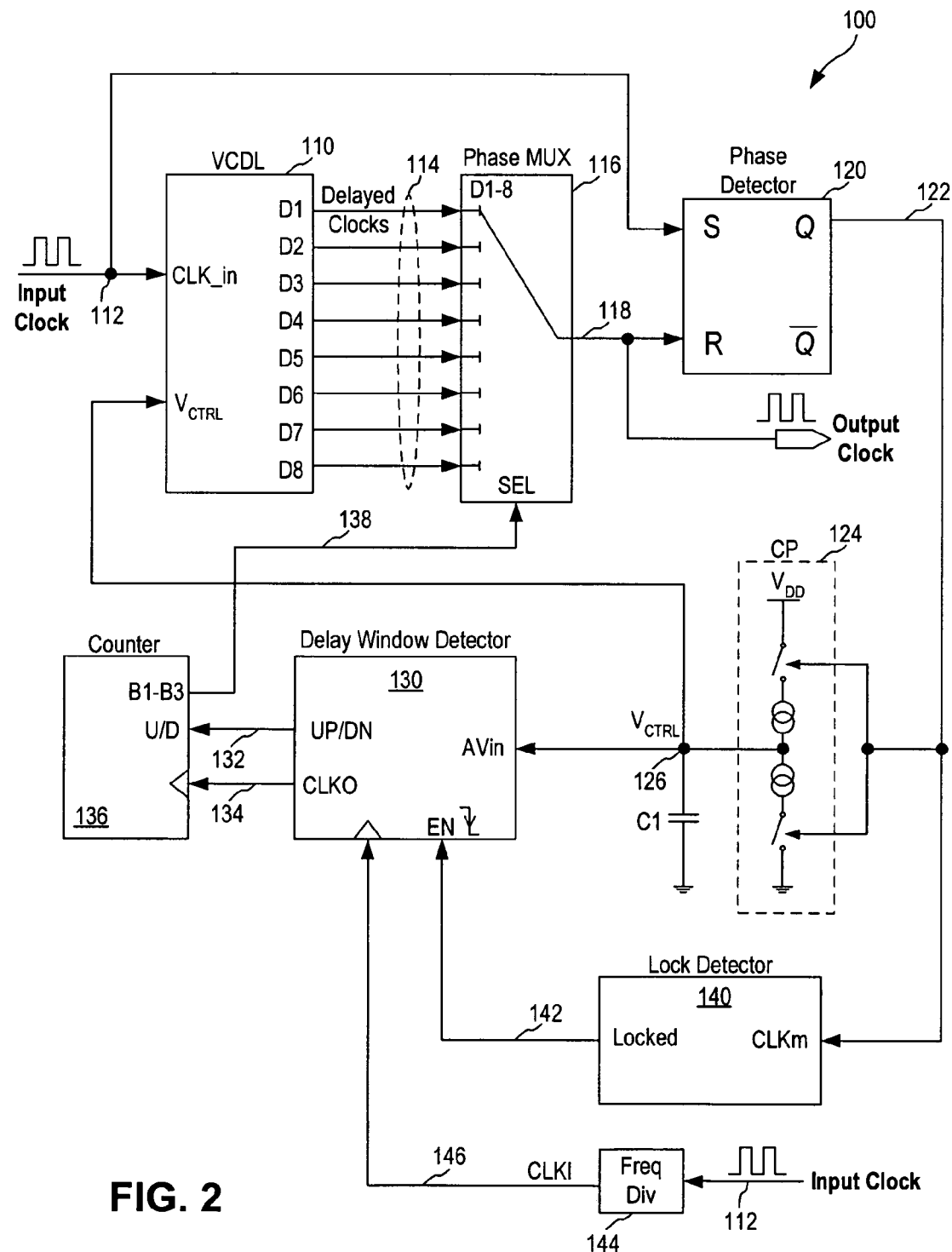
FIG. 2 is a schematic diagram of an adaptive frequency variable delay-locked loop according to one embodiment of the present invention.

FIG. 2 is a schematic diagram of an adaptive frequency variable delay-locked loop according to one embodiment of the present invention. Referring to FIG. 2, an input clock signal on node 112 is provided to the clock input terminal CLK_in of a voltage controlled delay line (VCDL) 110. Voltage controlled delay lines are known in the art and VCDL 110 can be implemented as a conventional delay chain including multiple delay stages where the delay provided by each delay stage is modulated by a control voltage $V_{CTRL}$. VCDL 110 provides a set of delayed clock signals having multiple clock phases as output signals D1 to D8. Specifically, the set of delayed clock signals includes clock signals having an increasing amount of delay from output signal D1 to output signal D8.

Figure 1:
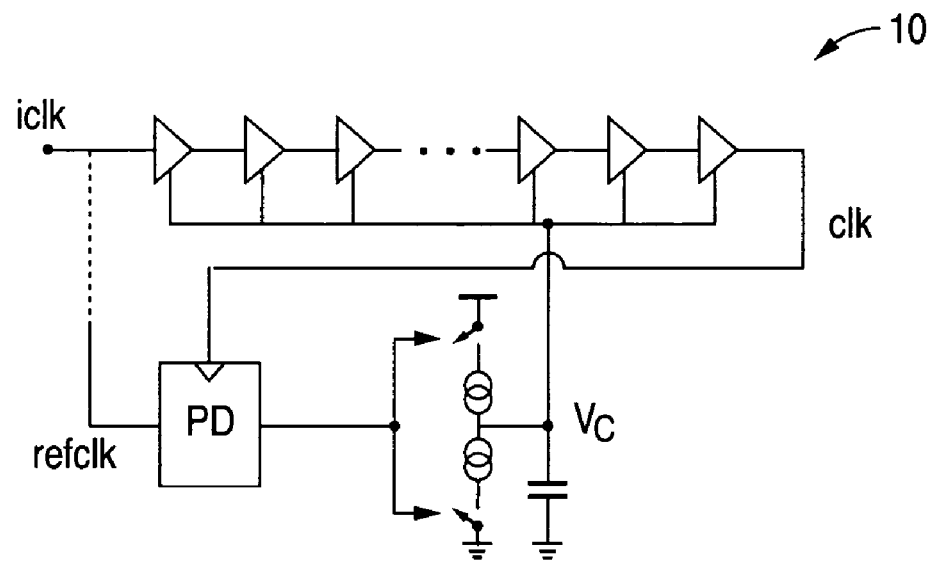
FIG. 1 is a schematic diagram of a conventional delay-locked loop.
Figure 3:
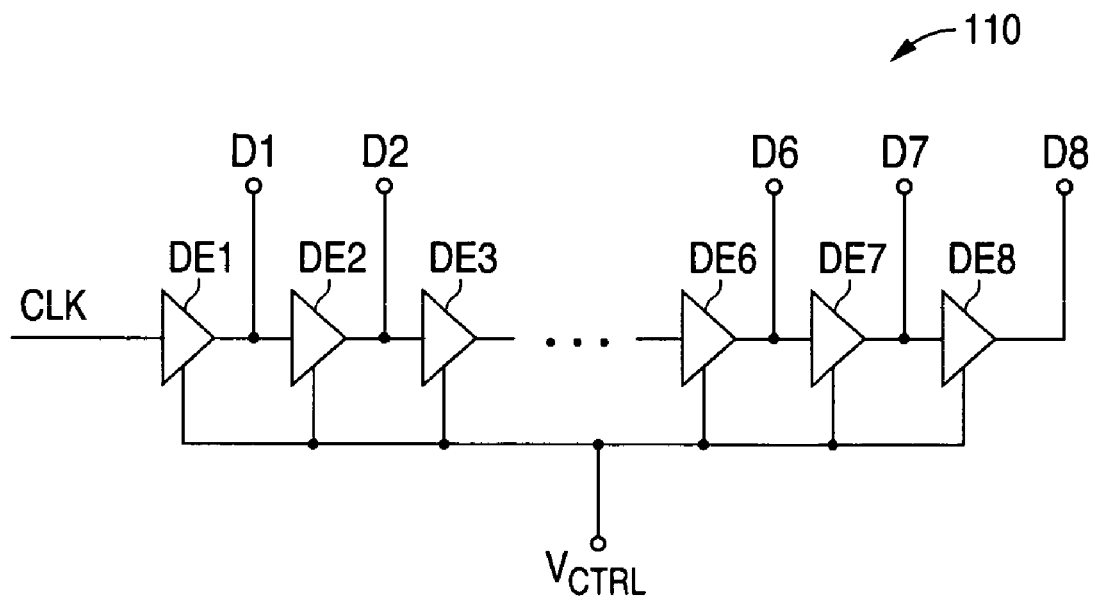
FIG. 3 is a circuit diagram of a voltage-controlled delay line (VCDL) according to one embodiment of the present invention.

FIG. 3 is a circuit diagram of a voltage-controlled delay line (VCDL) which can be used to implement VCDL 110 in DLL 100 of FIG. 2 according to one embodiment of the present invention. Referring to FIG. 3, VCDL 110 includes multiple serially connected delay stages DE1 to DEN. In the present illustration, eight delay stages are used thus VCDL 110 includes delay stages DE1 to DE8, providing corresponding output signals D1 to D8. Each delay stage is controlled by control voltage $V_{CTRL}$ to provide a predetermined amount of delay. The input clock signal CLK_in is coupled to the input terminal of the first delay stage DE1. Each delay stage provides an output signal being a delayed clock signal relative to its own input clock signal where the amount of delay provided by each delay stage is determined by the control voltage $V_{CTRL}$. Therefore, each delay stage provides a progressively delayed clock signal from the input clock signal. The set of output signals D1 to D8 thus have clock phases representing incrementally increasing amount of clock delay. Specifically, delay stage DE1 provides an output signal D1 being the input clock signal CLK_in delayed by one delay stage. Meanwhile, delay stage DE8 provides an output signal D8 being the input clock signal CLK_in delayed by eight delay stages. In accordance with the present invention, the delayed clock signal from each delay stage of the delay line is coupled as an output signal from VCDL 110.

Returning to FIG. 2, the set of delay clock signals 114 generated by VCDL 110 is coupled as input signals to a clock phase multiplexer 116 (herein after "phase MUX" 116). In the present illustration, phase MUX 116 is an eight-to-one multiplexer selecting one of eight input signals D1 to D8 based on a select signal SEL. The size of phase MUX 116 of course is dependent on the number of delay stages used in VCDL 110. In general, when VCDL 110 has N number of delay stages, phase MUX 116 will be an N-to-1 multiplexer. Select signal SEL represents a one or more bits select signal where the number of bits required for select signal SEL is determined by the number of input signals to be selected, as is well known in the art. When directed by select signal SEL, phase MUX 116 provides one of the delay clock signals D1 to D8 as its output signal on an output node 118. The output signal from phase MUX 118 is the output clock of DLL 100.

By using phase MUX 116, any one of the multiple delayed clock signals from VCDL 110 can be selected as the output clock signal for DLL 100. Because each delayed clock signal has a different clock phase relative to the input clock signal, phase MUX 116 operates to provide coarse phase adjustment in DLL 100. The select signal SEL is generated by a feedback control loop in DLL 100 to direct phase MUX 116 to select a delayed clock signal of the desired phase based on the requirement amount of delay. The generation of select signal SEL will be described in more detail below.

DLL 100 includes circuitry for forming two feedback control loops to drive VCDL 110 and phase MUX 116 so as to cause the output clock signal to have a delay that is locked to the input clock signal. First, DLL 100 includes a phase detection feedback control loop. The output clock (node 118) from phase MUX 116 as well as the input clock (node 112) are coupled to a phase detector 120 to be compared. In the present embodiment, phase detector 120 is implemented as a set-reset flip-flop (SR-flip flop) where the input clock (node 112) is coupled to the set input terminal and output clock (node 118) is coupled to the reset input terminal. Phase detector 120 provides an output signal Q on a node 122 indicative of the phase difference between the input clock and the output clock.

The use of a SR-flip flop as phase detector 120 in the present embodiment is illustrative only. Phase detector 120 can be implemented using other circuit elements for comparing the input clock to the output clock and determining the phase difference thereof. The use of a SR-flip flop has a particular advantage when the DLL of the present invention is applied as a duty cycle stabilizer. When the DLL of the present invention is used in a duty cycle stabilizer application, the phase detector 120 can be configured as a SR-flip flop where the output signal Q having a 50% duty cycle is used to indicate a lock condition.

The output signal Q (node 122) from phase detector 120 is coupled to a charge pump (CP) circuit 124. The output terminal (node 126) of charge pump circuit 124 is coupled to a loop filter 126 implemented as a capacitor C1. The charge pump circuit 124 and capacitor C1 operate in conjunction to integrate the output signal of phase detector 120 and generate control voltage $V_{CTRL}$ driving VCDL 110. Specifically, charge pump circuit 124 includes a first charge pump generating a charge up voltage signal and a second charge pump generating a charge down (discharge) voltage signal. The output signal Q from phase detector 120 causes charge pump circuit 124 to either charge up or discharge the control voltage on node 126. Capacitor C1 integrates the charge associated with the charge up or charge down voltage signals provided by charge pump circuit 124, thereby generating the control voltage $V_{CTRL}$.

In general, the phase detection feedback loop formed by phase detector 120, charge pump 124 and the loop filter (capacitor C1) drives the control voltage $V_{CTRL}$ to a value that forces a zero phase error between the output clock and the input clock. In the present illustration, DLL 100 is used as a duty cycle stabilizer, therefore the phase detection feedback loop operates to drive the control voltage $V_{CTRL}$ to a value that forces a 50% duty cycle for the phase detector output signal. Other control schemes for the feedback control loop can be used depending on the application of DLL 100.

In accordance with the present invention, DLL 100 includes a second feedback control loop for generating select signal SEL for phase MUX 116 to select one clock phase from the set of input signals having multiple clock phases. The phase selection feedback control loop in DLL 100 includes a delay window detector 130 and a counter 136. Delay window detector 130 is an analog voltage level detector and receives control voltage $V_{CTRL}$ as an input signal on an input terminal AVin and a clock signal CLKI (node 146) on a clock input terminal. Delay window detector 130 measures the voltage level of control voltage $V_{CTRL}$ and provides output signals indicative of the voltage level of the control voltage. Specifically, delay window detector 130 generates output signals which are coupled to counter 136 to increment, decrement or hold the count of the counter. Counter 136 generates select signal SEL for driving phase MUX 116. In response to the select signal SEL, phase MUX 116 selects a delayed clock signal having a larger, a smaller, or the same amount of delays relative to the input clock. In other words, delay window detector 130 causes phase MUX 116 to increment or decrement or hold the number of delay stages selected as the output clock signal.

In the present embodiment, delay window detector 130 generates an UP/DN output signal (node 132) as a first output signal and a CLKO signal (node 134) as a second output signal. Delay window detector 130 also receives an enable EN signal on a node 142. The enable EN signal activates the phase selection control loop when asserted and puts the phase selection control loop into a hold state when deasserted. In the present embodiment, the enable EN signal is active low and is thus asserted to activate the phase selection control loop when the EN signal is at a logical low level. The generation of the enable EN signal will be described in more detail below.

In the present embodiment, clock signal CLKI is a divided down version of the input clock on node 112. Specifically, the input clock (on node 112) is coupled to a frequency divider 144 to be divided down into clock signal CLKI. The divided clock signal CLKI is used by delay window detector 130 to generate a CLKO signal coupled to counter 136 as the counter's clock signal. A divided down clock signal is desired in the present embodiment to cause delay window detector 130 operates at a slow clock rate than the input clock signal to allow the phase detection control loop time to respond to generate the control voltage $V_{CTRL}$ before the phase selection control loop kicks in to adjust the phase selection. In one embodiment, frequency divider 144 is a divide-by-16 frequency divider. However, in other embodiments, frequency division of the input clock may not be necessary and frequency divider 144 can be omitted or it can be implemented as a divide-by-1 divider. In that case, the CLKO signal driving counter 136 has the same frequency as the input clock signal on node 112.

In delay window detector 130, the output clock signal CLKO is generated by a logical combination of the input clock signal CLKI, the enable signal EN and the voltage detection result. Output clock signal CLKO is either toggling at the same rate as clock signal CLKI or it is held at a predetermined logical level. When clock signal CLKO is toggling, counter 136 is caused to count up or down depending on the state of the U/D input signal. When clock signal CLKO is held, counter 136 holds its current count. Clock signal CLKO is held when the enable signal EN is deasserted or when the voltage of control voltage $V_{CTRL}$ is within a range where changes in the phase selection of phase MUX 116 is not necessary.

Control voltage $V_{CTRL}$, generated by charge pump circuit 126 and capacitor C1, is an analog voltage signal having a magnitude that varies between 0 volts and the supply voltage $V_{DD}$ coupled as the positive supply voltage of charge pump circuit 124. Control voltage $V_{CTRL}$, generated by the phase detection feedback loop, has a voltage level that contains valid phase delay information for the DLL. Specifically, the voltage level of voltage $V_{CTRL}$ determines how much delay needs to be provided by each delay stage in order to achieve locking. In other words, the delay provided by each delay cell is directly proportional to the control voltage $V_{CTRL}$. Therefore, a large voltage level of control voltage $V_{CTRL}$ indicates that a large amount of delay is needed from the delay chain while a low voltage level of control voltage $V_{CTRL}$ indicates that a very small amount of delay is needed from the delay chain.

In operation, control voltage $V_{CTRL}$ varies between the positive power supply $V_{DD}$ voltage and the ground voltage. Delay window detector 130 establishes two threshold voltages $V_{THH}$ and $V_{THL}$ for control voltage $V_{CTRL}$. High threshold voltage $V_{THH}$ denotes a high voltage threshold for control voltage $V_{CTRL}$ while low threshold voltage $V_{THL}$ denotes a low voltage threshold for control voltage $V_{CTRL}$. In one embodiment, high threshold voltage $V_{THH}$ is about 80% of the $V_{DD}$ voltage while low threshold voltage $V_{THL}$ is about 20% of the $V_{DD}$ voltage.

When the control voltage $V_{CTRL}$ exceeds the high threshold voltage $V_{THH}$ and therefore reaches the positive power supply $V_{DD}$ voltage, it is an indication that a large amount of delay is required in order for the output clock to track the input clock. Furthermore, when the control voltage $V_{CTRL}$ reaches the power supply voltage $V_{DD}$, it is also an indication that the maximum delay that is provided by the currently selected delayed clock signal may be insufficient to allow the output clock to track the input clock. Delay window detector 130 then outputs the UP/DN output signal having a first logical level (for example, a logical "high" level) to instruct counter 136 to increment its output count. Counter 136 will increment its output count on the next clock pulse of clock signal CLKO.

On the other hand, when the control voltage $V_{CTRL}$ is below the low threshold voltage $V_{THL}$ and therefore reaches the ground voltage, it is an indication that a small amount of delay is required in order for the output clock to track the input clock. When the control voltage $V_{CTRL}$ reaches the ground voltage, it is also an indication that the minimum delay that is provided by the currently selected delayed clock signal may still be too large. Delay window detector 130 then outputs the UP/DN output signal having a second logical level (for example, a logical "low" level) to instruct counter 136 to decrement its output count. Counter 136 will decrement its output count on the next clock pulse of clock signal CLKO.

Alternately, control voltage $V_{CTRL}$ can have a voltage value between the high threshold voltage $V_{THH}$ and the low threshold voltage $V_{THL}$. In that case, delay window detector 130 holds the clock signal CLKO to cause counter 136 to hold its count. When the clock signal CLKO is held, that is, does not toggle, counter 136 does not count and will hold its current count value.

Counter 136 generates a three-bit output signal B1:B3 based on the UP/DN signal and the clock signal CLKO provided by delay window detector 130. The output signal B1:B3 are provided to phase MUX 116 as select signal SEL. When counter 136 is instructed by delay window detector 130 to increase its count, indicating that a larger phase delay is required, select signal SEL causes phase MUX 116 to select a delayed clock input signal having the next larger number of delay stages than the currently selected delayed clock input signal. In this manner, a delayed clock signal with a larger phase delay is selected as the output signal and the control voltage $V_{CTRL}$ can be modulated to allow the output clock to track the input clock within this phase delay frequency range.

On the other hand, when counter 136 is instructed by delay window detector 130 to decrease its count, indicating that a smaller phase delay is required, select signal SEL causes phase MUX 116 to select a delayed clock input signal having the next smaller number of delay stages than the currently selected delayed clock input signal. Thus, a delayed clock signal with a smaller phase delay is selected as the output signal and the control voltage $V_{CTRL}$ can be modulated to allow the output clock to track the input clock within this phase delay frequency range.

Finally, when counter 136 is instructed by delay window detector 130 to hold its count, select signal SEL causes phase MUX 116 to hold the currently selected delayed clock input signal. When delay window detector 130 holds the count value for counter 136, the phase delay required can be accomplished using the currently selected delayed clock input signal by modulating control voltage $V_{CTRL}$.

DLL 100 in accordance with the present invention thus includes a phase detection feedback control loop for generating the control voltage $V_{CTRL}$ to provide fine adjustment of the phase error within a selected clock phase and a phase selection feedback control loop for generating the select signal SEL to select a clock phase from among multiple clock phases having an incrementally increasing amount of phase delay. In this manner, the phase selection feedback loop operates as the coarse phase selection control while the phase detection feedback loop operates as the fine phase adjustment control. DLL 100 can thus provide a very large frequency locking range as wide as that of the conventional PLLs while providing jitter performance better than the conventional PLLs.

In one embodiment, the power supply $V_{DD}$ voltage is 3 volts. The high threshold voltage $V_{THH}$ is selected as 2.3 volts and the low threshold voltage $V_{THL}$ is selected as 0.7 volts. When control voltage $V_{CTRL}$ is between 0.7 and 2.3 volts, the currently selected clock phase is used to provide the output clock signal. When control voltage $V_{CTRL}$ is greater than 2.3 volts, a larger phase delay is required. Delay window detector 130 causes select signal SEL to increase to select the clock phase with the next higher number of delay stages. When control voltage $V_{CTRL}$ is less than 0.7 volts, a smaller phase delay is required. Delay window detector 130 causes select signal SEL to decrease to select the clock phase with the next smaller number of delay stages.

Figure 4:
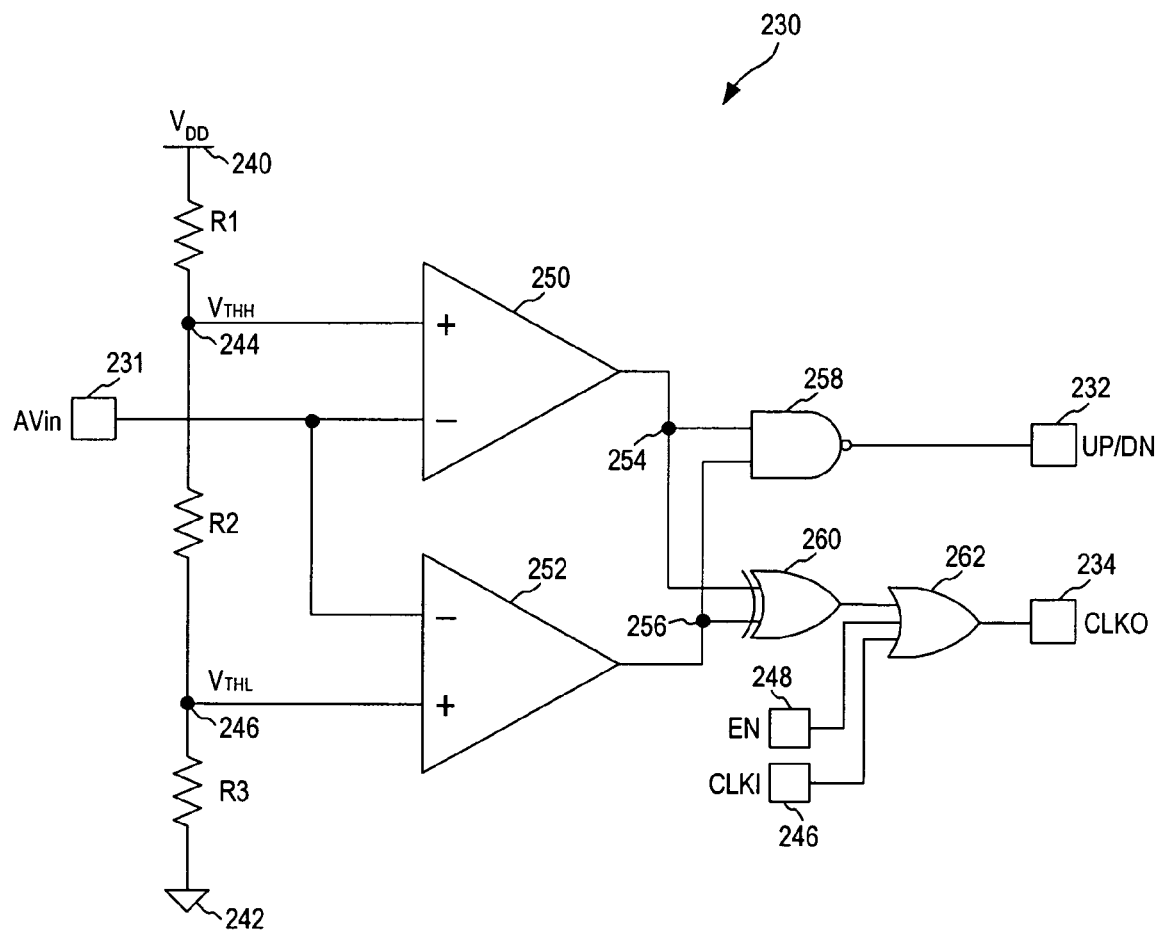
FIG. 4 is a circuit diagram of a window delay detector which can be incorporated in the DLL of FIG. 2 according to one embodiment of the present invention.

FIG. 4 is a circuit diagram of a window delay detector which can be incorporated in the DLL of FIG. 2 according to one embodiment of the present invention. Referring to FIG. 4, window delay detector 230 includes two comparators for comparing the analog input voltage ($V_{CTRL}$) coupled to the AVin input terminal 231 to the high and low threshold voltage levels. Specifically, a first comparator 250 compares the analog input voltage $V_{CTRL}$ to the high threshold voltage $V_{THH}$ while a second comparator 252 compares the analog input voltage $V_{CTRL}$ to the low threshold voltage $V_{THL}$. A resistor string including resistors R1 to R3 connected between the power supply voltage $V_{DD}$ (node 240) and the ground voltage (node 242) is used to generate the high and low threshold voltages. The high threshold voltage $V_{THH}$ is generated at a node 244 between resistor R1 and resistor R2 while the low threshold voltage $V_{THH}$ is generated at a node 246 between resistor R2 and resistor R3. In the present embodiment, resistors R1 and R3 have the same resistance values and the notation "R1" is used to denote the resistance of both resistors R1 and R3 while the notation "R2" denotes the resistance of resistor R2. The high and low threshold voltages are given as follows:

$$V_{THH} = V_{DD}\left(1 - \frac{R1}{2R1 + R2}\right);$$

and $$V_{THL} = V_{DD}\left(\frac{R1}{2R1 + R2}\right).$$

The high threshold voltage $V_{THH}$ is coupled to the positive input terminal and the analog input voltage $V_{CTRL}$ is coupled to the negative input terminal of first comparator 250. Meanwhile, the low threshold voltage $V_{THL}$ is coupled to the positive input terminal and the analog input voltage $V_{CTRL}$ is coupled to the negative input terminal of first comparator 252.

The output signals of comparators 250 and 252 on nodes 254 and 256 respectively are coupled to an NAND logic gate 258 and are also coupled to an XOR logic gate 260. The output signal (node 232) of NAND logic gate 258 is the UP/DN signal. The output signal of XOR gate 260 is coupled to an OR gate 262 where the XOR output signal is OR'ed with the enable signal EN provided on node 248 and the clock signal CLKI on node 246. The output signal (node 234) of OR gate 262 is the output clock signal CLKO.

The operation of delay window detector 230 will now be described. First, it is assumed that the enable signal EN is asserted. In the present embodiment, enable signal EN is an active low signal. Thus, enable signal EN has a logical low level when asserted to activate the phase selection control loop and a logical high level when deasserted to deactivate the phase selection control loop. When control voltage $V_{CTRL}$ is greater than the high threshold voltage $V_{THH}$, both comparators 250 and 252 provide a logical low output signal. NAND gate 258 provides a logical high output signal as the UP/DN output signal to instruct the counter to increase its count. Meanwhile, XOR gate 260 provides a logical low output. At OR gate 262, when the enable signal EN is at a logical low and the XOR gate output signal is also at a logical low, the output signal of the OR gate follows the clock signal CLKI. Thus, the output clock signal CLKO (node 234) follows clock signal CLKI which is a divided down clock of the input clock signal. When the CLKO signal is toggling, the counter will respond to the UP/DN signal to increase its count.

When control voltage $V_{CTRL}$ is less than the low threshold voltage $V_{THL}$, both comparators 250 and 252 provide a logical high output signal. NAND gate 258 provides a logical low output signal as the UP/DN output signal to instruct the counter to decrease its count. Meanwhile, XOR gate 260 provides a logical low output. Similar to the condition described above, at OR gate 262, when the enable signal EN is at a logical low and the XOR gate output signal is also at a logical low, the output signal of the OR gate follows the clock signal CLKI. Thus, the output clock signal CLKO (node 234) follows clock signal CLKI. When the CLKO signal is toggling, the counter will respond to the UP/DN signal to decrease its count.

Finally, when control voltage $V_{CTRL}$ is between the high threshold voltage $V_{THH}$ and the low threshold voltage $V_{THL}$, comparator 250 provides a logical high output signal while comparator 252 provide a logical low output signal. NAND gate 258 provides a logical high output signal as the UP/DN output signal. Meanwhile, XOR gate 260 provides a logical high output causing OR gate 262 to be asserted to a logical high state, regardless of the state of the other input signals to the OR gate. Clock signal CLKO is thus held at a logical high level. When clock signal CLKO is held at a logical high or a logical low level, that is, when clock signal CLKO does not toggle, the counter will not count and will instead hold its current count value.

Now, when enable signal EN is deasserted (logical high) to deactivate the phase selection control loop, OR gate 262 is forced to a logical high level regardless of the logical state of the XOR output signal or the CLKI signal. The output clock signal CLKO is therefore forced to a logical high by the enable signal EN to cause the counter to hold its count.

In delay window detector 230, a three-input OR gate 262 is used to implement the enabling function of the phase selection control loop. In other embodiments, when deactivation of the phase selection control loop is not needed, the enable EN signal can be eliminated and OR gate 262 is implemented as a two-input OR gate receiving only the XOR gate output signal and the clock signal CLK1 as input signals. The clock signal CLKO is therefore only held when the control voltage is between the high threshold voltage and the low threshold voltage. One of ordinary skill in the art would appreciate that the delay window detector of the present invention can be implemented using other combination of logic gates to effectuate the same detection operation. The use of specific logic gates in the delay window detector of FIG. 4 is illustrative only.

Returning to FIG. 2, in the present embodiment, DLL 100 further includes lock detection circuitry for improving the stability of the DLL operation. Specifically, DLL 100 includes a lock detector 140 for monitoring the output signal of phase detector 122 to detect the lock condition. Lock detector 140 generates the enable signal EN on node 142 for controlling delay window detector 130. In this manner, when lock detector 140 detects from the phase detector output signal that a lock condition has been reached, the enable signal EN is deasserted to deactivate the phase selection control loop. Counter 136 will hold its current count and phase MUX 116 will hold its current clock phase selection.

When lock detector 140 detects from the phase detector output signal that the output clock is no longer tracking the input clock, the lock detector will assert enable signal EN to allow the phase selection control loop to once again operate to provide increase frequency tracking capability in DLL 100.

While lock detection is an optional feature in DLL 100, the inclusion of lock detection in the delayed-locked loop can ensure stability and prevents phase MUX 116 from bouncing between clock phase selections when the control voltage $V_{CTRL}$ is near the high or low threshold voltages $V_{THH}$ and $V_{THL}$ of delay window detector 130. For instance, when DLL 100 is locked while the control voltage $V_{CTRL}$ is near the high threshold voltage $V_{THH}$, delay window detector 130 may switch between detecting a hold condition or an increment condition, causing phase MUX 116 to switch between two neighboring clock phases, resulting in the output clock signal oscillating. In accordance with the present invention, when lock detector 140 detects a lock condition, the phase selection control loop is deactivated by disabling clock signal CLKO to hold the currently selected clock phase. Thus, stability of operation is ensured.

In the present illustration, DLL 100 is applied as a duty cycle stabilizer and the first and second feedback loops of DLL 100 operates until the output signal Q has a 50% duty cycle. Thus, DLL 100 is locked when the output signal Q from phase detector 120 has a 50% duty cycle. In the present embodiment, lock detector 140 is coupled to measure the output signal Q from phase detector 120 and generates a Locked output signal having a first logical value when 50% duty cycle in the output signal Q is detected. In the present embodiment, the Locked signal has a logical high value when the DLL is locked, that is, the output signal Q is at 50% duty cycle, and the Locked signal has a logical low value when the DLL is not locked, that is, the output signal Q is not at 50% duty cycle. When the DLL is locked (Locked signal at logical high), the phase selection control loop is to be deactivated.

In operation, when lock detector 140 detects that the DLL is unlocked, the Locked signal is at a logical low value and is coupled to delay window detector 130 as the enable signal EN. Thus, delay window detector 130 will toggle clock signal CLKO depending on the result of the control voltage detection. Alternately, when lock detector 140 detects that the DLL is locked, the Locked signal is at a logical high value. When the Locked signal is at a logical high level, the enable signal EN will also be at a logical high level, thereby deactivating the phase selection control loop.

The performance capability of the DLL of the present invention will now be illustrated in the simulation result plots of FIGS. 5 to 10. As described above, DLL 100 of the present invention has been applied to a duty cycle stabilizer (DCS). When applied as such, the simulation result showed the DLL of the present invention has unlimited locking range from tens of MHz to a few GHz. Therefore, the DLL of the present invention can keep track of input frequency change as well as a PLL. Such large frequency tracking capability cannot be achieved by conventional DLLs.

Figure 5:
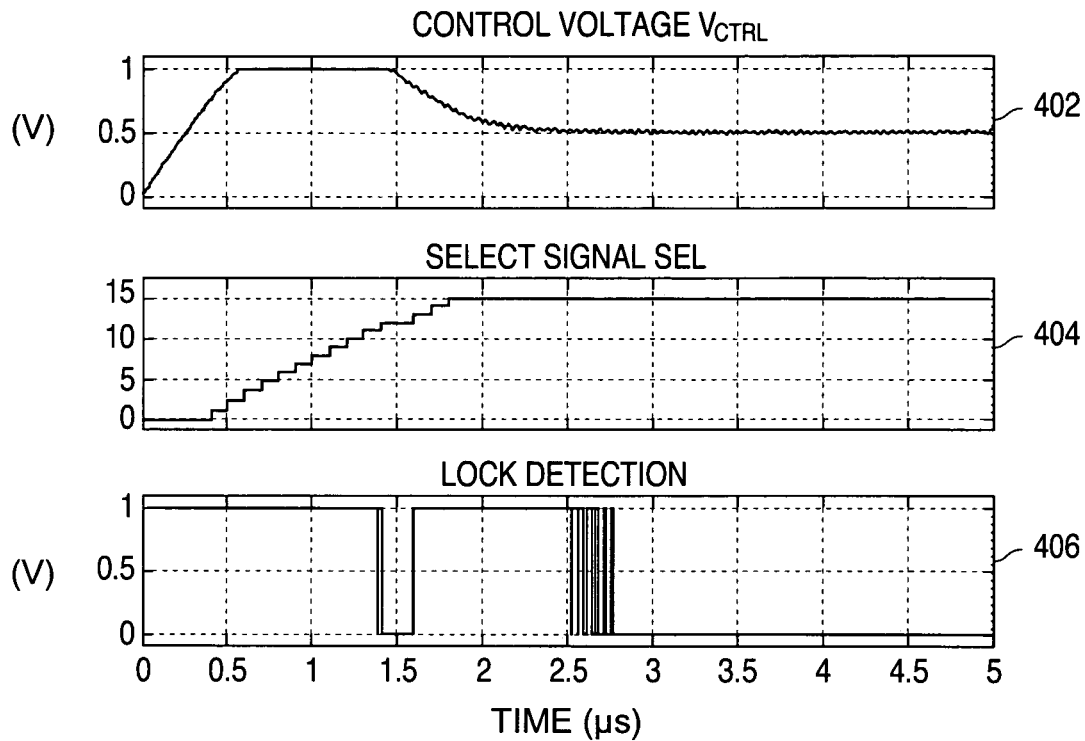
FIG. 5 illustrates the signal waveform of the control voltage $V_{CTRL}$, the select signal SEL, and the Locked signal from the lock detection circuit in the DLL of the present invention when operated at an input clock frequency of about 20 MHz.
Figure 6:
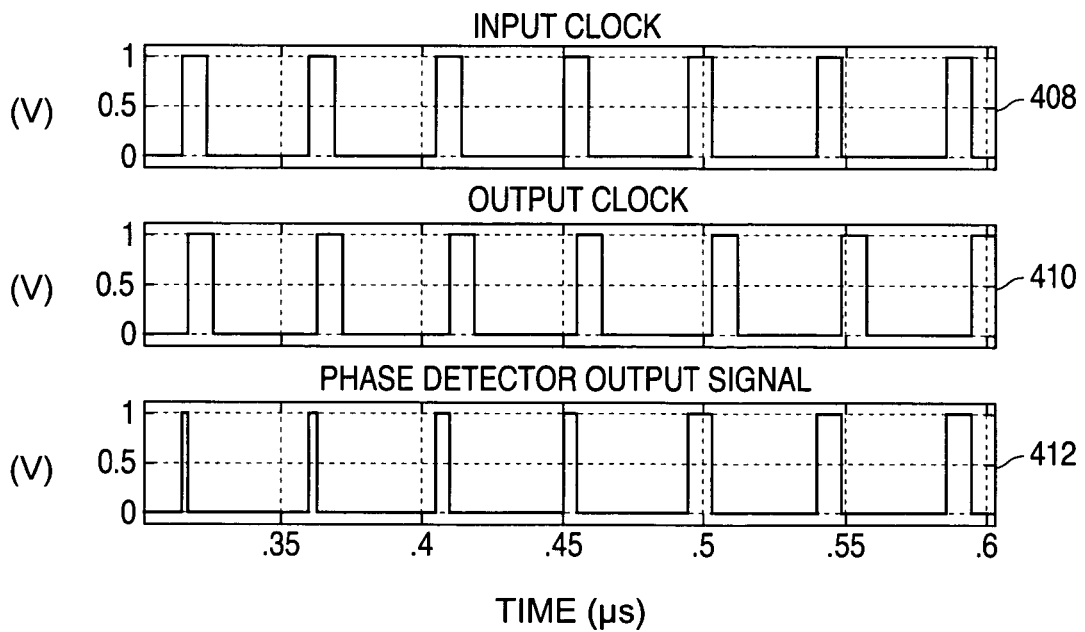
FIG. 6 illustrates the signal waveforms of the input clock, the output clock and the phase detector output signal under the timing conditions of FIG. 5 while the DLL is unlocked.
Figure 7:
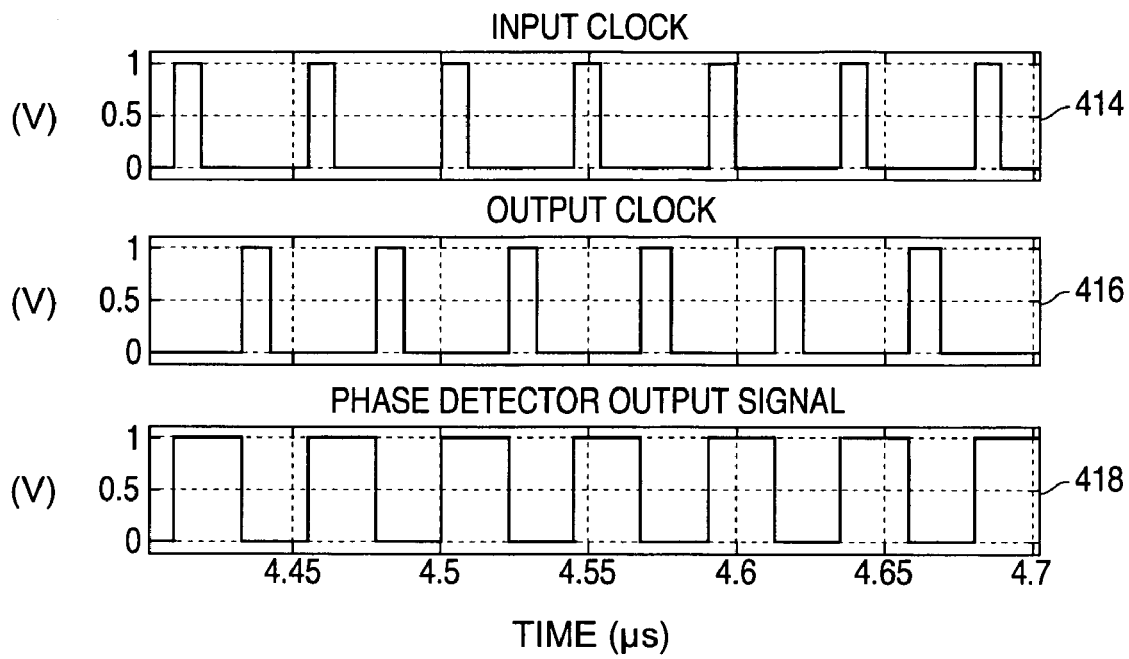
FIG. 7 illustrates the signal waveforms of the input clock, the output clock and the phase detector output signal under the timing conditions of FIG. 5 while the DLL is locked.

FIG. 5 illustrates the signal waveform of the control voltage $V_{CTRL}$, the select signal SEL, and the Locked signal from the lock detection circuit in the DLL of the present invention when operated at an input clock frequency of about 20 MHz. FIG. 6 illustrates the signal waveforms of the input clock, the output clock and the phase detector output signal under the timing conditions of FIG. 5 while the DLL is unlocked. FIG. 7 illustrates the signal waveforms of the input clock, the output clock and the phase detector output signal under the timing conditions of FIG. 5 while the DLL is locked. In the present illustration, the voltage-controlled delay line has 16 delay stages—from delay stage 0 to delay stage 15. Also, FIGS. 5–7 have voltage levels normalized to 1 volt. In actual operations, the maximum voltage is the power supply $V_{DD}$ voltage which can be anywhere from 0.8 volts to 5 volts. Furthermore, FIG. 5 illustrates a Locked signal having inverse logical states than that used in FIG. 2 above. That is, as shown in FIG. 5, the Locked signal has a logical low value to indicate a locked condition and a logical high value to indicate an unlocked condition. One of ordinary skill in the art would appreciate that the exact logical state of the Locked signal or the enable signal EN is not critical for the implementation of the DLL of the present invention and that the Locked signal can be readily inverted to the desired logical states using a variety of logic elements, including an inverter.

Referring to FIG. 5, control voltage $V_{CTRL}$ (curve 402) first increases from its initial value of 0 volts to a maximum value (normalized to 1 volt) before settling to 0.5 volts (50% of the normalized maximum voltage value) at about 2 µs. Meanwhile, the select signal SEL (curve 404) is shown to increase from the first delay stage (delay stage 0) to the last delay stage (delay stage 15). Finally, as shown by curve 406, the lock detection circuit first detects a lock condition at 1.5 µs but a definitive lock condition is actually not reached until about 2.75 µs. FIG. 5 illustrates the lowest possible input clock frequency, about 20 MHz, which can still be tracked by the DLL of the present invention.

Referring to FIG. 6, the input clock (curve 408) and the output clock (curve 410) are not yet locked, therefore, the phase detector output signal (curve 412) does not have a 50% duty cycle. Referring to FIG. 7, the input clock (curve 414) and the output clock (curve 416) are finally locked. Therefore, the phase detector output signal (curve 418) now has a 50% duty cycle.

Figure 8:
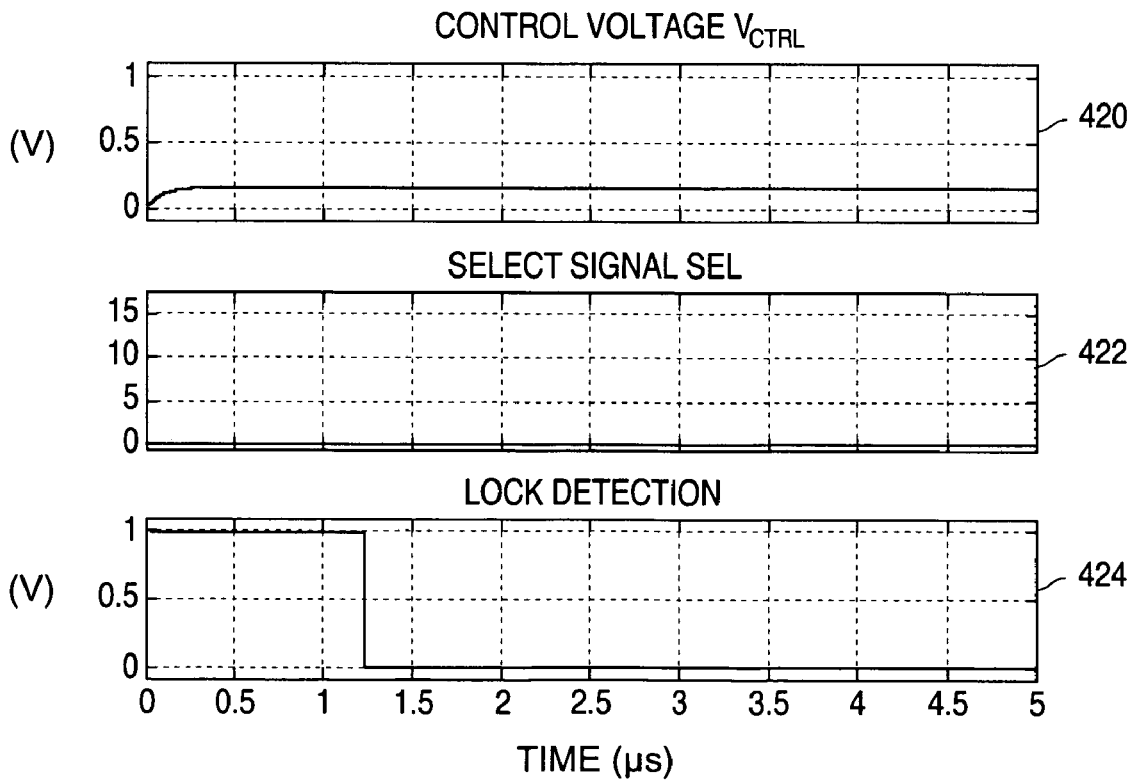
FIG. 8 illustrates the signal waveform of the control voltage $V_{CTRL}$, the select signal SEL, and the Locked signal from the lock detection circuit in the DLL of the present invention when operated at an input clock frequency of about 1 GHz.
Figure 9:
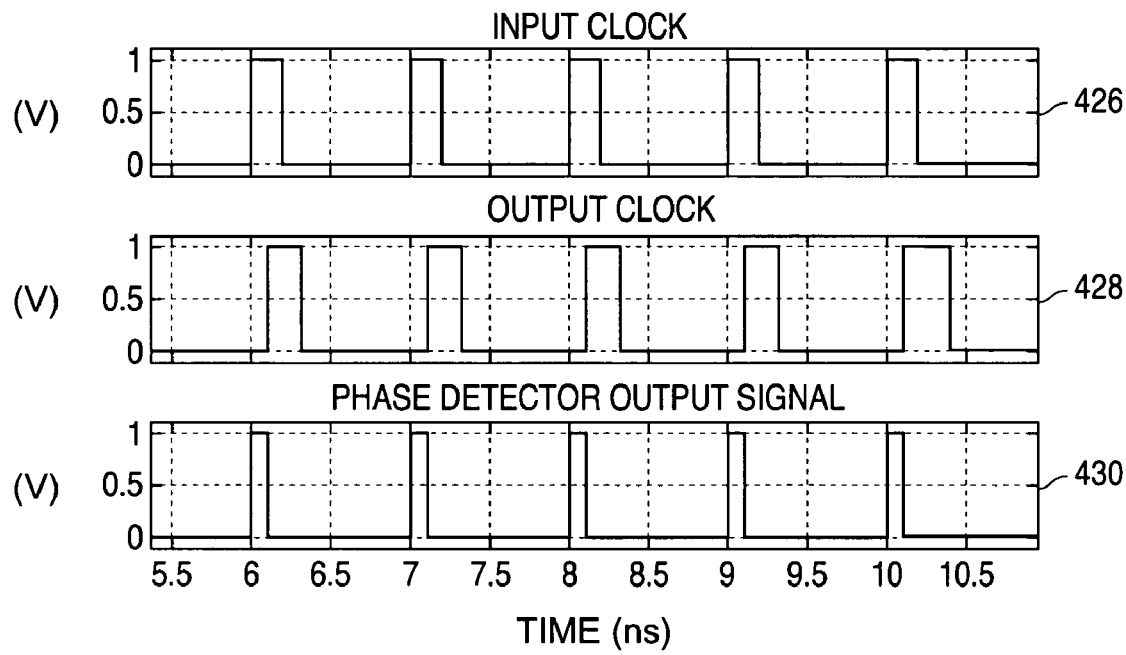
FIG. 9 the signal waveforms of the input clock, the output clock and the phase detector output signal under the timing conditions of FIG. 8 while the DLL is unlocked.
Figure 10:
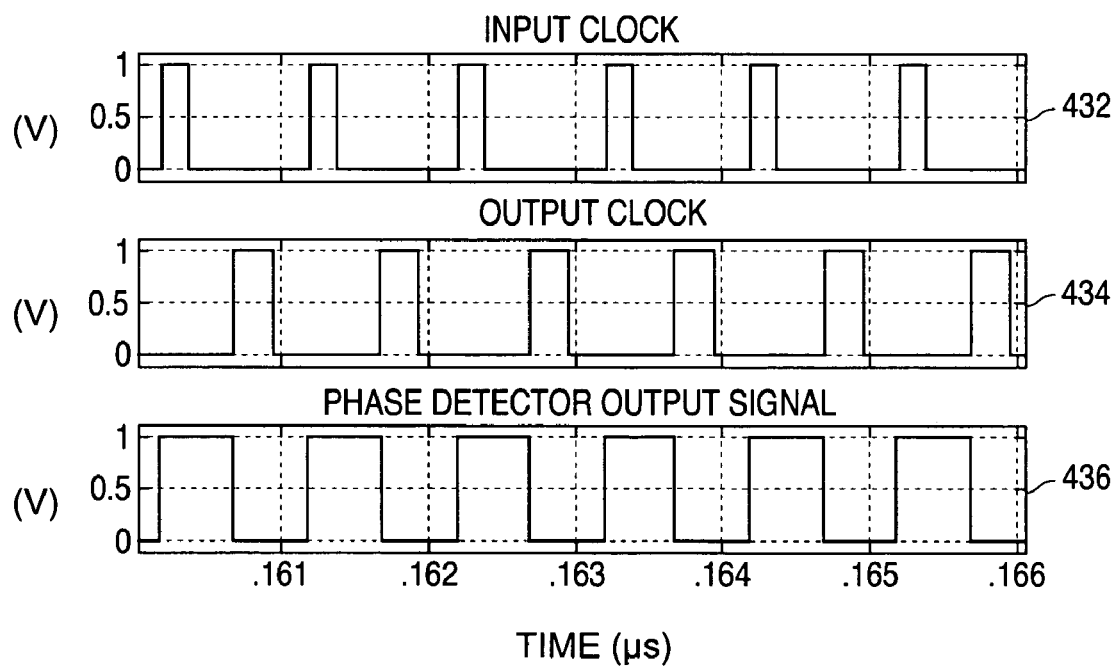
FIG. 10 the signal waveforms of the input clock, the output clock and the phase detector output signal under the timing conditions of FIG. 8 while the DLL is locked.

FIG. 8 illustrates the signal waveform of the control voltage $V_{CTRL}$, the select signal SEL, and the Locked signal from the lock detection circuit in the DLL of the present invention when operated at an input clock frequency of about 1 GHz. FIG. 9 the signal waveforms of the input clock, the output clock and the phase detector output signal under the timing conditions of FIG. 8 while the DLL is unlocked. FIG. 10 the signal waveforms of the input clock, the output clock and the phase detector output signal under the timing conditions of FIG. 8 while the DLL is locked. FIG. 8 illustrates a Locked signal having inverse logical states than that used in FIG. 2 above. That is, as shown in FIG. 8, the Locked signal has a logical low value to indicate a locked condition and a logical high value to indicate an unlocked condition.

Referring to FIG. 8, control voltage $V_{CTRL}$ (curve 420) first increases from its initial value of 0 volts to a voltage value of about 0.4 volts (normalized). Meanwhile, the select signal SEL (curve 422) is shown select the first delay stage (delay stage 0). Finally, as shown by curve 424, the lock detection circuit detects a lock condition at 1.25 µs. FIG. 8 illustrates the highest possible input clock frequency, about 1 GHz, which can be tracked by the DLL of the present invention.

Referring to FIG. 9, the input clock (curve 426) and the output clock (curve 428) are not yet locked, therefore, the phase detector output signal (curve 430) does not have a 50% duty cycle. Referring to FIG. 10, the input clock (curve 432) and the output clock (curve 434) are finally locked. Therefore, the phase detector output signal (curve 436) now has a 50% duty cycle.

FIGS. 5 to 10 illustrates the wide frequency operating range of the DLL of the present invention. Locking frequency range from a few MHz to a few GHz is possible in the DLL of the present invention by using feedback loop to select different clock phases depending on the amount of clock delay required. By changing the amount of delay to use in the delayed clock signal, the DLL locking range can be extended as wide as a conventional PLL. The DLL of the present invention can have as wide a locking range as a PLL, while having better jitter performance, which is an ideal performance combination long sought after in the clock generation circuit art.

The DLL of the present invention provides other advantages including not using phase interpolation, not requiring additional front-end PLL/DLL.

The above detailed descriptions are provided to illustrate specific embodiments of the present invention and are not intended to be limiting. Numerous modifications and variations within the scope of the present invention are possible. The present invention is defined by the appended claims.

I claim:

1. A delay-locked loop circuit receiving an input clock signal and generating an output clock signal whose delay is locked to the input clock, the circuit comprising:
   a voltage controlled delay line comprising a plurality of delay elements, the voltage controlled delay line receiving the input clock signal and generating a plurality of delayed clock signals having increasing amount of phase delay from a first delayed clock signal to a last delayed clock signal, the plurality of delay elements being controlled by a control voltage operative to vary the amount of phase delay provided by each delay element;
   a multiplexer receiving the plurality of delayed clock signals as input signals and also receiving a select signal, the multiplexer providing a selected one of the delayed clock signals as an output signal based on the select signal, the output signal of the multiplexer being the output clock signal;
   a phase detection control loop adapted to measure the phase difference between the input clock signal and the output clock signal and to generate the control voltage to adjust the amount of delay provided by each delay element in the voltage controlled delay line; and
   a phase selection control loop adapted to measure the voltage level of the control voltage and, based on the voltage level of the control voltage, to generate the select signal for the multiplexer to cause the multiplexer to select a delayed clock signal with an increased or decreased amount of phase delay relative to the currently selected delayed clock signal or to hold the currently selected delayed clock signal.

2. The delay-locked loop circuit of claim 1, wherein:
   the phase selection control loop generates the select signal to cause the multiplexer to select a delayed clock signal with an increased amount of delay relative to the currently selected delayed clock signal when the control voltage has a voltage level greater than a high threshold voltage;
   the phase selection control loop generates the select signal to cause the multiplexer to select a delayed clock signal with a decreased amount of delay relative to the currently selected delayed clock signal when the control voltage has a voltage level less than a low threshold voltage; and
   the phase selection control loop generates the select signal to cause the multiplexer to hold the currently selected delayed clock signal when the control voltage has a voltage level between the high threshold voltage and the low threshold voltage.

3. The delay-locked loop circuit of claim 2, wherein the control voltage has a voltage variation between the ground voltage and a positive power supply voltage, the high threshold voltage comprises a voltage value of about 80% of the positive power supply voltage and the low threshold voltage comprises a voltage value of about 20% of the positive power supply voltage.

4. The delay-locked loop circuit of claim 1, wherein the voltage controlled delay line comprises a plurality of serially connected buffers as the delay elements, each buffer being controlled by the control voltage to vary the amount of phase delay provided.

5. The delay-locked loop circuit of claim 1, wherein the phase detection control loop comprises:
   a phase detector coupled to compare the phases of the input clock signal and the output clock signal and to provide an output signal indicative of the phase difference between the input clock signal and the output clock signal;
   a charge pump circuit receiving the output signal from the phase detector and generating a charge up signal and a charge down signal; and
   a loop filter integrating the charge associated with the charge up and the charge down signals, thereby generating the control voltage.

6. The delay-locked loop circuit of claim 2, wherein the phase selection control loop comprises:
   a delay window detector receiving the control voltage and a second clock signal, the delay window detector comparing the control voltage to the high threshold voltage and the low threshold voltage, the delay window detector generating an UP/DN output signal having a first logical state when the control voltage is greater than the high threshold voltage and having a second state when the control voltage is less than the low threshold voltage, the delay window detector further generating a third clock signal indicative of the second clock signal when the control voltage is greater than the high threshold voltage or less than the low threshold voltage, the third clock signal being held at a first logical state when the control voltage is between the high threshold voltage and the low threshold voltage; and
   a counter coupled to receive the UP/DN output signal and the third clock signal, the counter providing a count value as an output signal, the count value being the select signal for the multiplexer,
   wherein the counter increments the count value in response to the third clock signal when the UP/DN output signal has the first logical state, the counter decrements the count value in response to the third clock signal when the UP/DN output signal has the second logical state, and the counter holds the current count value when the third clock signal is held at the first logical state.

7. The delay-locked loop circuit of claim 6, wherein the second clock signal comprises a divided down version of the input clock signal.

8. The delay-locked loop circuit of claim 6, wherein the delayed window detector comprises:
   a first comparator having a positive input terminal coupled to the high threshold voltage, a negative input terminal coupled to the control voltage and an output terminal providing a first comparison output signal;
   a second comparator having a positive input terminal coupled to the low threshold voltage, a negative input terminal coupled to the control voltage and an output terminal providing a second comparison output signal;

a first logic gate coupled to perform a logical NAND operation of the first and second comparison output signals, the first logic gate providing the UP/DN output signal as an output signal;

a second logic gate coupled to perform a logical XOR operation of the first and second comparison output signals and providing an output signal; and a third logic gate coupled to perform a logical OR operation of the output signal of the second logic gate and the second clock signal, the third logic gate providing the third clock signal as an output signal.

9. The delay-locked loop circuit of claim 8, wherein the delay window detector further receives an enable signal having a first logical state for activating the phase selection control loop and a second logical state for deactivating the phase selection control loop.

10. The delay-locked loop circuit of claim 9, wherein the enable signal has the first logical state indicating an unlock condition where the delay of the output clock signal is not locked to the input clock signal and the second logical state indicating a lock condition where the delay of the output clock signal is locked to the input clock signal.

11. The delay-locked loop circuit of claim 10, wherein the third logic gate of the delay window detector comprises:

a three-input logic gate coupled to perform a logical OR operation of the output signal of the second logic gate, the second clock signal, and the enable signal, the three-input logic gate providing the third clock signal.

12. The delayed-lock loop circuit of claim 1, further comprising:

a lock detection circuit adapted to monitor the phase difference between the input clock signal and the output clock signal as measured by the phase detection control loop, the lock detection circuit providing an enable signal having a first logical state indicating an unlock condition where the delay of the output clock signal is not locked to the input clock signal and a second logical state indicating a lock condition where the delay of the output clock signal is locked to the input clock signal.

13. The delayed-lock loop circuit of claim 12, wherein the enable signal is coupled to the phase selection control loop to activate the phase selection control loop when the enable signal has the first logical state and to deactivate the phase selection control loop when the enable signal has the second logical state.

* * * * *